US009456516B2

(12) United States Patent
Heiskanen

(10) Patent No.: US 9,456,516 B2
(45) Date of Patent: Sep. 27, 2016

(54) APPARATUS FOR A CARD HOLDER

(71) Applicant: Nokia Corporation, Espoo (FI)

(72) Inventor: Juuso Heiskanen, Kaarina (FI)

(73) Assignee: Nokia Technologies Oy, Espoo (FI)

(*) Notice: Subject to any disclaimer, the term of this patent is extended or adjusted under 35 U.S.C. 154(b) by 509 days.

(21) Appl. No.: 13/723,664

(22) Filed: Dec. 21, 2012

(65) Prior Publication Data

US 2013/0163160 A1 Jun. 27, 2013

(30) Foreign Application Priority Data

Dec. 21, 2011 (EP) .................................. 11194848

(51) Int. Cl.
*H05K 7/14* (2006.01)
*G06K 7/00* (2006.01)

(52) U.S. Cl.
CPC ............. *H05K 7/14* (2013.01); *G06K 7/0021* (2013.01); *H05K 7/1461* (2013.01)

(58) Field of Classification Search
CPC ............ H05K 5/0295; H05K 5/0286; H05K 7/1461; H05K 7/14; G06F 1/184; G06F 1/185; G06F 1/186; G06F 1/187; G06F 1/1656; G06K 13/18; G06K 13/0831; G06K 7/0021; H04B 1/3816; H04M 1/026; H04M 1/0283; H04M 2250/14; H04M 1/0235; H04M 1/0202
See application file for complete search history.

(56) References Cited

U.S. PATENT DOCUMENTS

| | | | | |
|---|---|---|---|---|
| 6,017,230 A * | 1/2000 | Yao | ...................... | G11B 33/122 439/159 |
| 6,042,404 A * | 3/2000 | Lai | .......................... | G06K 13/08 439/159 |
| 6,088,221 A * | 7/2000 | Bolognia | ................ | 361/679.37 |
| 6,332,658 B1 * | 12/2001 | Sato | ...................... | G06F 1/1616 312/223.2 |
| 6,971,914 B1 * | 12/2005 | Chou et al. | .............. | 439/607.01 |
| 7,594,766 B1 * | 9/2009 | Sasser et al. | ................... | 385/89 |
| 2008/0096606 A1 | 4/2008 | Park et al. | | |
| 2009/0267677 A1 | 10/2009 | Myers et al. | | |
| 2013/0044412 A1* | 2/2013 | Quan | ................ | G06K 13/0825 361/679.01 |

FOREIGN PATENT DOCUMENTS

DE 10339931 A1 3/2005

OTHER PUBLICATIONS

European Search Report for corresponding patent application EP 11194848.5 mailed May 7, 2012.

* cited by examiner

*Primary Examiner* — Hoa C Nguyen
*Assistant Examiner* — Christopher L Augustin
(74) *Attorney, Agent, or Firm* — Harrington & Smith

(57) ABSTRACT

A card holder comprising: a tray configured to receive a card, a door, and a resilient element wherein the resilient element is configured to move from a first position to a second position upon application of a force on the resilient element, and the door is configured to move relative to the tray upon movement of the resilient element.

20 Claims, 11 Drawing Sheets

APPARATUS FOR A CARD HOLDER

CROSS-REFERENCE TO RELATED APPLICATION(S)

This application claims priority from Application Serial No. EP1194848.5, filed 21 Dec. 2011 in the European Patent Office, and incorporated herein by reference in its entirety.

TECHNICAL FIELD

The present application relates generally to an apparatus for a card holder.

BACKGROUND

A card holder may be incorporated into an electronic device into which cards are mounted for inputting and/or outputting information to the electronic device.

It is known to incorporate a card holder into an electronic device usually at the back side of the electronic device, under a battery. It has become more common to incorporate a card holder into an electronic device at one of the sides of the electronic device, so that in case of an integral battery which is not user changeable, the user can access the card holder and therefore the card.

SUMMARY

Various aspects of examples of the invention are set out in the claims. According to a first aspect of the present invention there is a
card holder comprising:
a tray configured to receive a card,
a door,
and a resilient element coupled to the door and the tray, wherein the resilient element is configured to move from a first position to a second position upon application of a force on the resilient element, and the door is configured to move relative to the tray upon movement of the resilient element.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

An example embodiment of the present invention and its potential advantages are understood by referring to FIGS. 1 through 14 of the drawings.

Figure 1:
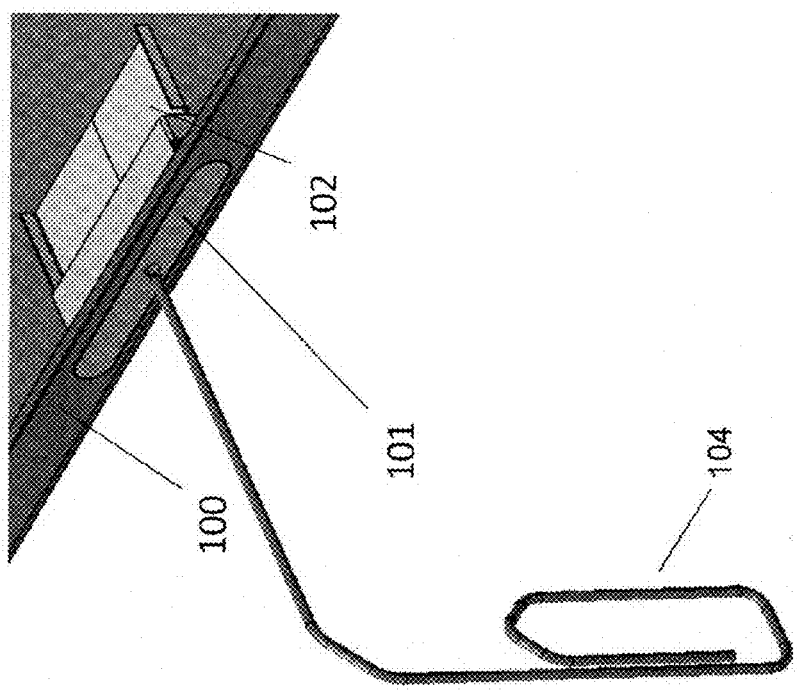
FIG. 1 presents an example embodiment of the invention, in which the card holder is in a first, closed position.

FIG. 1 is an example embodiment of the invention, in which a partial view of an electronic device 100 is shown. The partial view, shows one of the sides of the electronic device 100, is configured to house a card holder comprising a door 101 and a tray 102 coupled to the door 101. According to this example embodiment, the card holder is in a first position. An opening tool 104 can also be seen in use with the cardholder.

Figure 2:
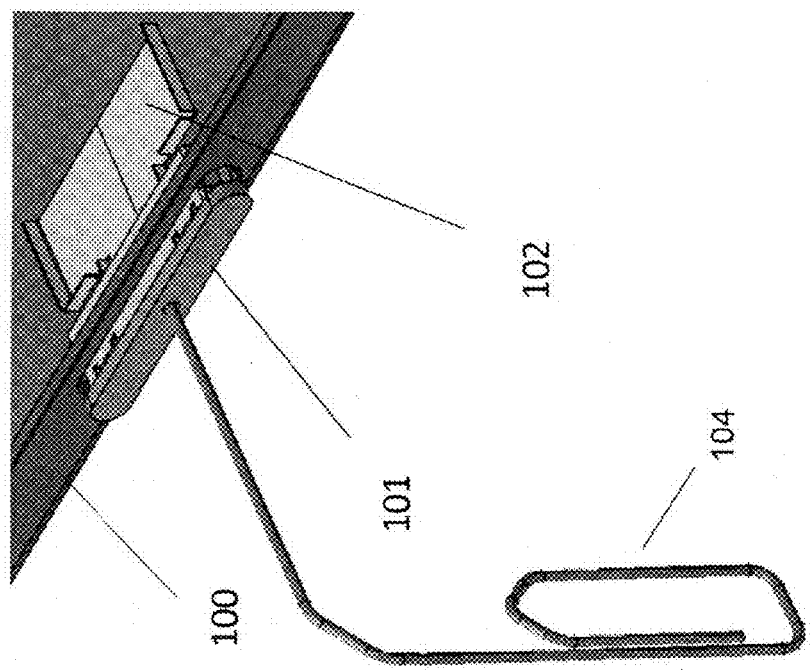
FIG. 2 presents an example embodiment of the invention, in which the card holder is in a second position.

FIG. 2 is an example embodiment of the invention, in which a partial view of an electronic device 100 is shown. The partial view, shows one of the sides of the electronic device 100, is configured to house a card holder comprising a door 101 and a tray 102 coupled to the door 101. Here too, the opening tool 104 can be seen in use with the cardholder. According to this example embodiment, the card holder is in a second position.

Figure 3:
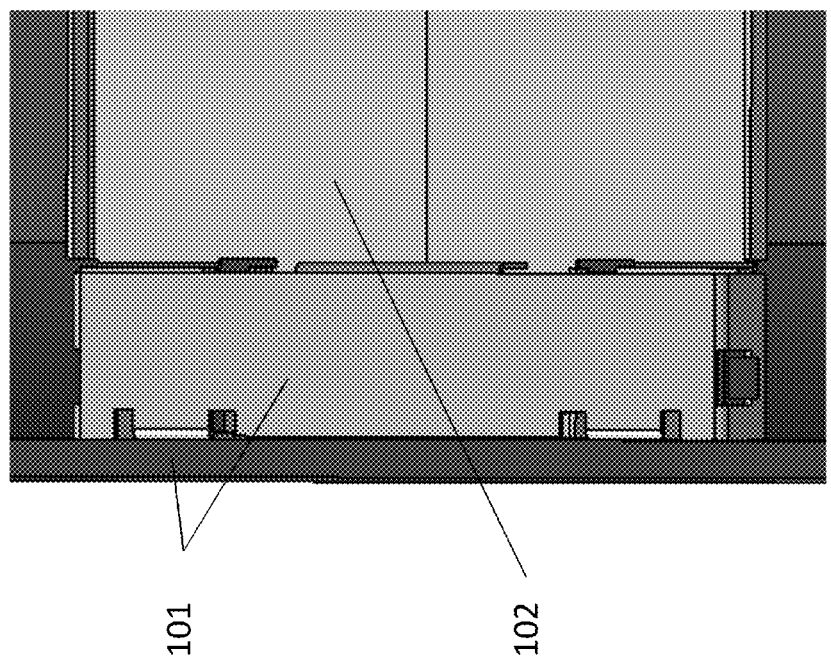
FIG. 3 presents an example embodiment of the invention, in which the card holder is in a first, closed position described from above.

FIG. 3 is an example embodiment of a card holder shown from above according to the example embodiment of FIG. 1.

Figure 4:
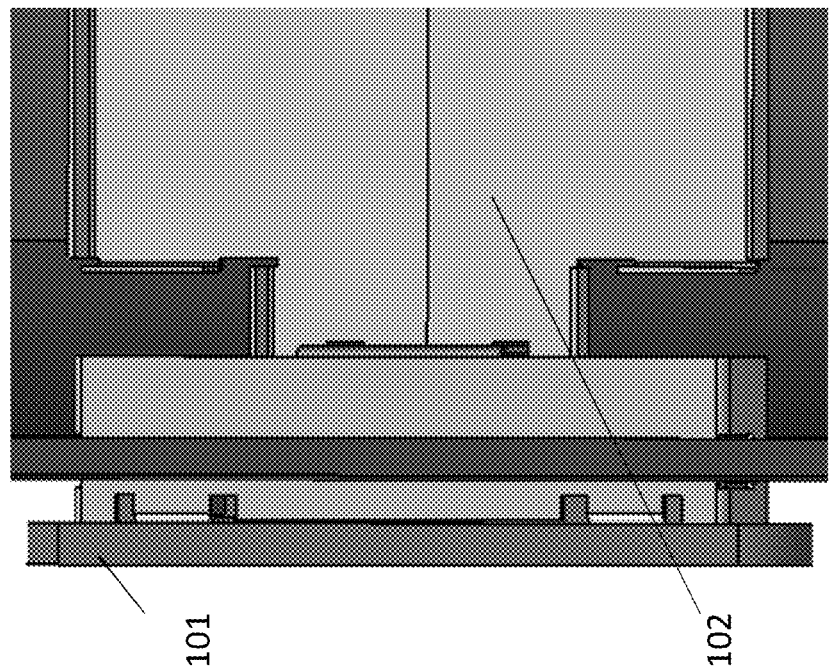
FIG. 4 presents an example embodiment of the invention, in which the card holder is in a second position described from above.

FIG. 4 is an example embodiment of a card holder shown from above according to the example embodiment of FIG. 2.

Figures 5, 6:
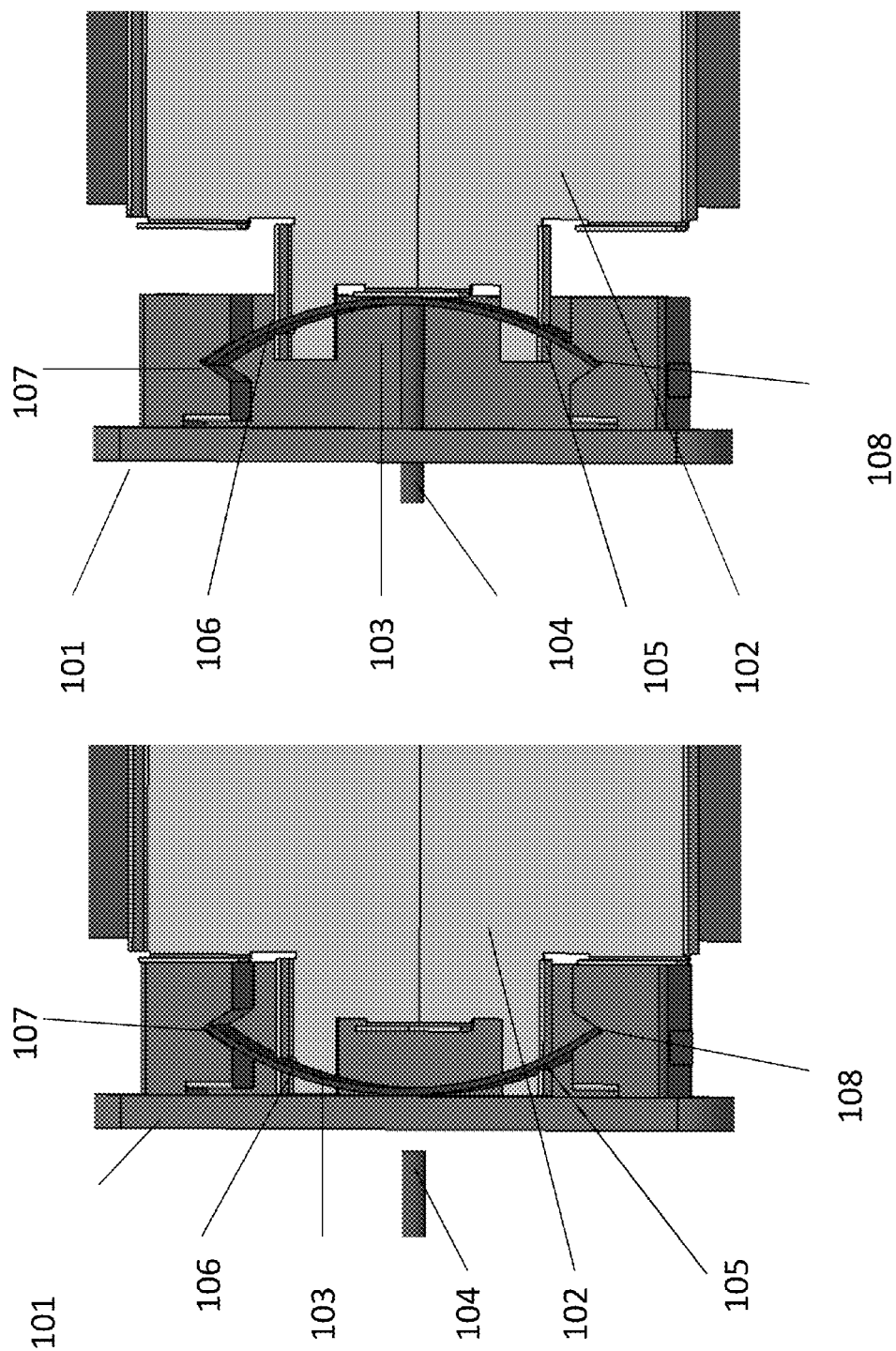
FIG. 5 presents an example embodiment of the invention, in which an opening tool is configured to press a resilient element and the resilient element is configured to buckle according to the press.
FIG. 6 presents an example embodiment of the invention, in which a door of the card holder is configured to open.

FIG. 5 is an example embodiment of a card holder in which a resilient element 103 has been shown. The resilient element 103 is a resilient element having two ends. According to this example embodiment, the resilient element 103 has a relatively flat, elongated shape. According to another example embodiment, the resilient element 103 comprises a spring. However any other shape is possible as well. For example but not limited to a spiral or a thread. The resilient element 103 is configured to be pressed by an opening tool 104. According to this example embodiment, the opening tool 104 is a paper clip which has been folded open in part so as to achieve a self-made tool for opening the card holder. However, any other tool may be used for opening the card holder. It is also possible not to use a specific tool for opening the card holder. The user may use for example his/her finger and or finger nail for opening the card holder. The opening tool 104 is configured to be received by an aperture in the door. The opening tool 104 is configured to reach the resilient element 103 through the aperture in the door. There are first slots 105 and 106 on both sides of the tray 102. The slots are configured to receive the resilient element 103. In an alternative embodiment the resilient element 103 may be attached to the tray 102. There are cavities 107 and 108 on both sides of the door 101 and dimensioned to receive the ends of the resilient element 103. The cavities 107 and 108 in the shown embodiment have a triangular shape with an apex so that the resilient element 103 is tightly fitted in these cavities 107 and 108, although still allowing a relative movement of the resilient element 103 in the cavities 107 and 108. The cavities 107 and 108 are configured to house the resilient element 103 from a longitudinal axis of the resilient element 103. According to this example embodiment, the cavities 107 and 108 have a shape of a cut. However, any other shape is possible, for example but not limited to a semi-circular notch. The cavities 107 and 108 are configured to enable two pivot points on a longitudinal axis of the resilient element 103. The resilient element 103 is configured to move from a first position into a second position around the two pivot points provided by the cavities 107 and 108. The first position of the resilient element 103 is configured to follow the first closed position of the card holder. The second position of the resilient element 103 is configured to follow the second position (FIGS. 2, 4 and 6) of the card holder. According to an example embodiment of FIG. 5, the resilient element 103 has a first, convex shape.

FIG. 6 is an example embodiment of a reading device assembly in which due to the pressing movement provided by the opening tool 104, the resilient element 103 is configured to be deflected so that the shape of the resilient element 103 is configured to change. According to this example embodiment shown in FIG. 6, the resilient element 103 has a second, concave shape. The difference in the shape of the resilient element 103 has been caused by the deflection resulting from a pressing movement provided by the opening tool 104. According to this example embodiment, the tray 102 is not configured to move even though the resilient element 103 is deflected due to an end portion of the tray 102 being arranged against an end wall of the card holder. According to this example embodiment, when an opening tool 104 is pressing the resilient element 103 from a substantially middle point of the resilient element 103, the resilient element 103 is likely to bend. If the opening tool 104 is not pressing the resilient element 103 enough to provide an opening of the door 101 or closing of the door 101, the resilient element 103 is configured to return to it's original position.

As can be seen by contrasting FIG. 5 and FIG. 6 as the resilient element is deflected between a first position in FIG. 5 and a second position in FIG. 6 the door 101 moves relative to the tray 102 and as shown in FIGS. 2 and 4 the door is also moving relative to the electronic device cover 100.

According to another example embodiment, there are components within the card holder device, which may act as a stopper element for the end portion of the tray 102 thereby enabling the tray 102 not to move.

Figure 7:
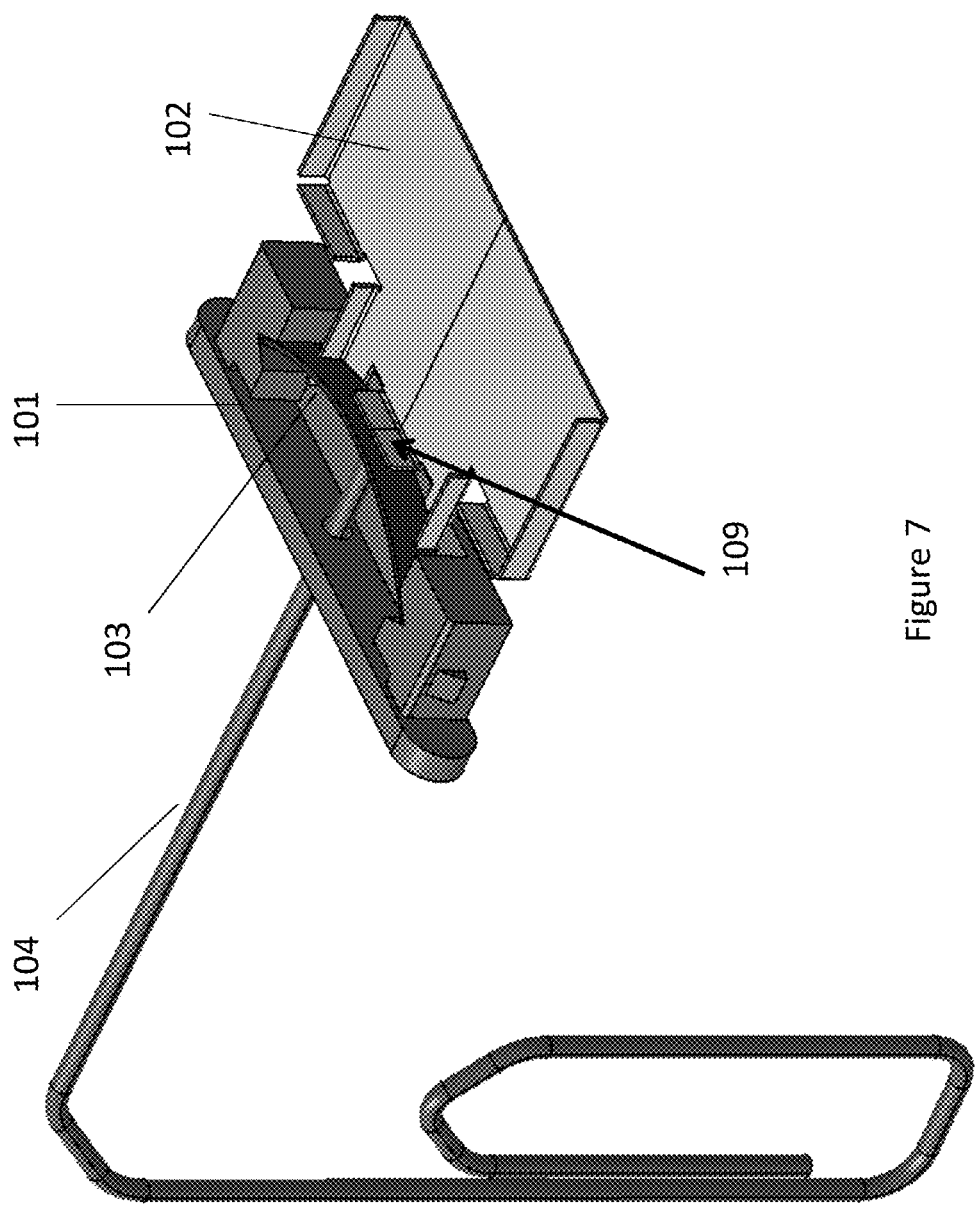
FIG. 7 presents an example embodiment of the invention, in which a flange is shown which is coupled to a tray of the card holder.

FIG. 7 is an example embodiment of a card holder in which the resilient element 103 is in a second position and a flange 109 is visible. The flange 109 is located on the tray 102 such that when the resilient element 103 is in a second concave position, the resilient element 103 is configured to touch the flange 109. According to this example embodiment, the flange 109 is a relatively flat component rising from the surface of the tray 102 to meet the resilient element 103 when the resilient element is in the second concave position. However the flange 109 may have any other shape which enables the flange 109 to contact the resilient element 103. The flange 109 may act as a stopper, for preventing the user to push the resilient element 103 too hard. The flange 109 may protect the resilient element 103 from being broken if the resilient element 103 is exposed to a significant amount of pressure. The flange 109 may act as an ejecting member for the card holder so as to enable the door 101 eject while the flange 109 meets the resilient member 103.

Figure 8:
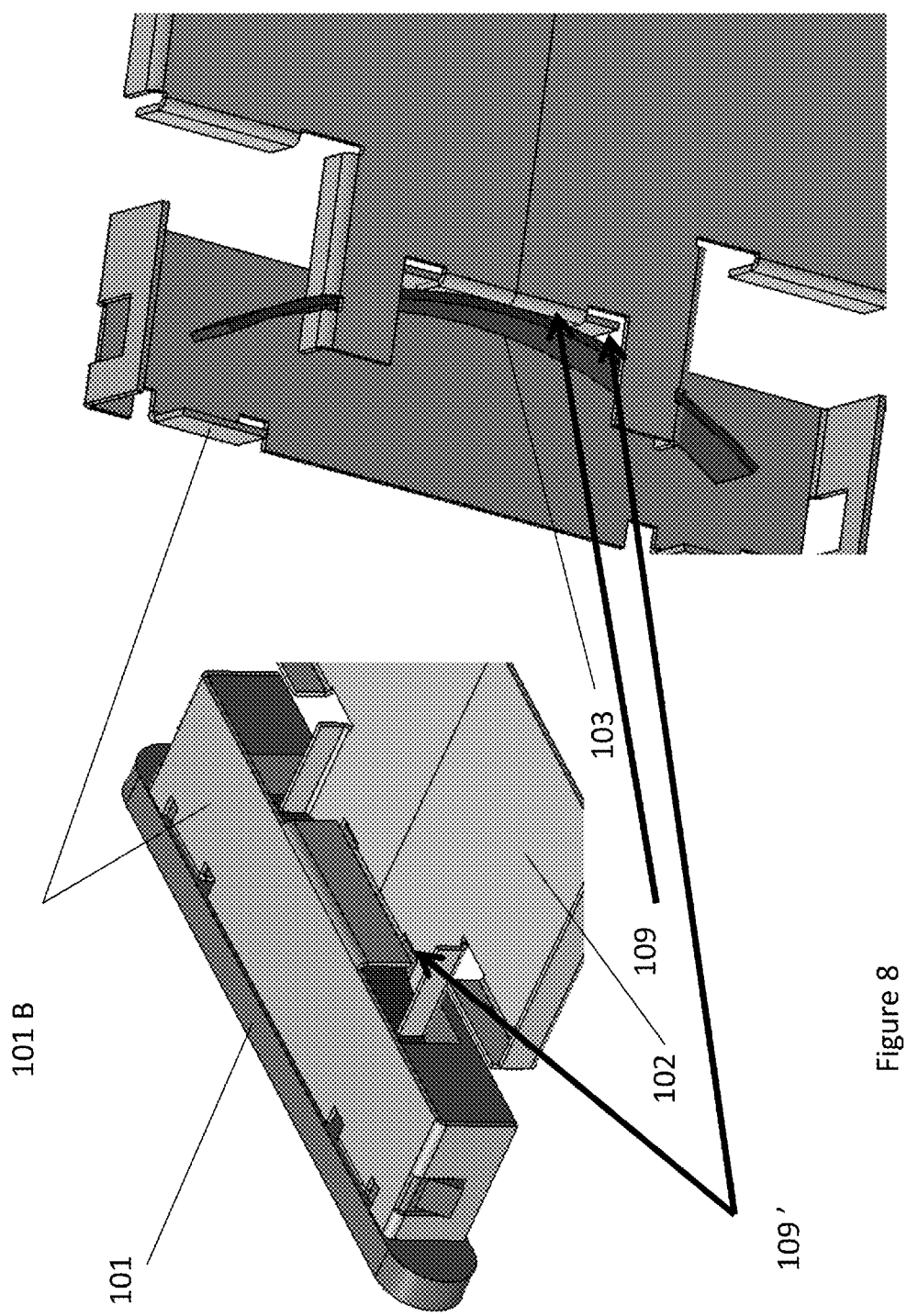
FIG. 8 presents an example embodiment of the invention, in which a flange is shown which is configured to pull out the tray when a door is pulled out by a finger.

FIG. 8 is an example embodiment of the invention according to which the resilient element is in the second position and abuts to the flange 109. The resilient element which is coupled to the slots 105, 106 of the tray 102 and the cavities 107, 108 of the door 101 provide coupling between the tray 102 and the door 101 to enable the tray 102 to be pulled out when the user is using for example his/her finger to pull the outer part of the door 101 thereby opening the door 101 of card holder. In addition a flange on the door 109' may couple to the flange 109 on the tray when the resilient element is in the second position. This flange can provide additional or all the coupling between the door and the tray so as to allow the user to pull out the tray 102 when pulling the door 101.

Figure 9:
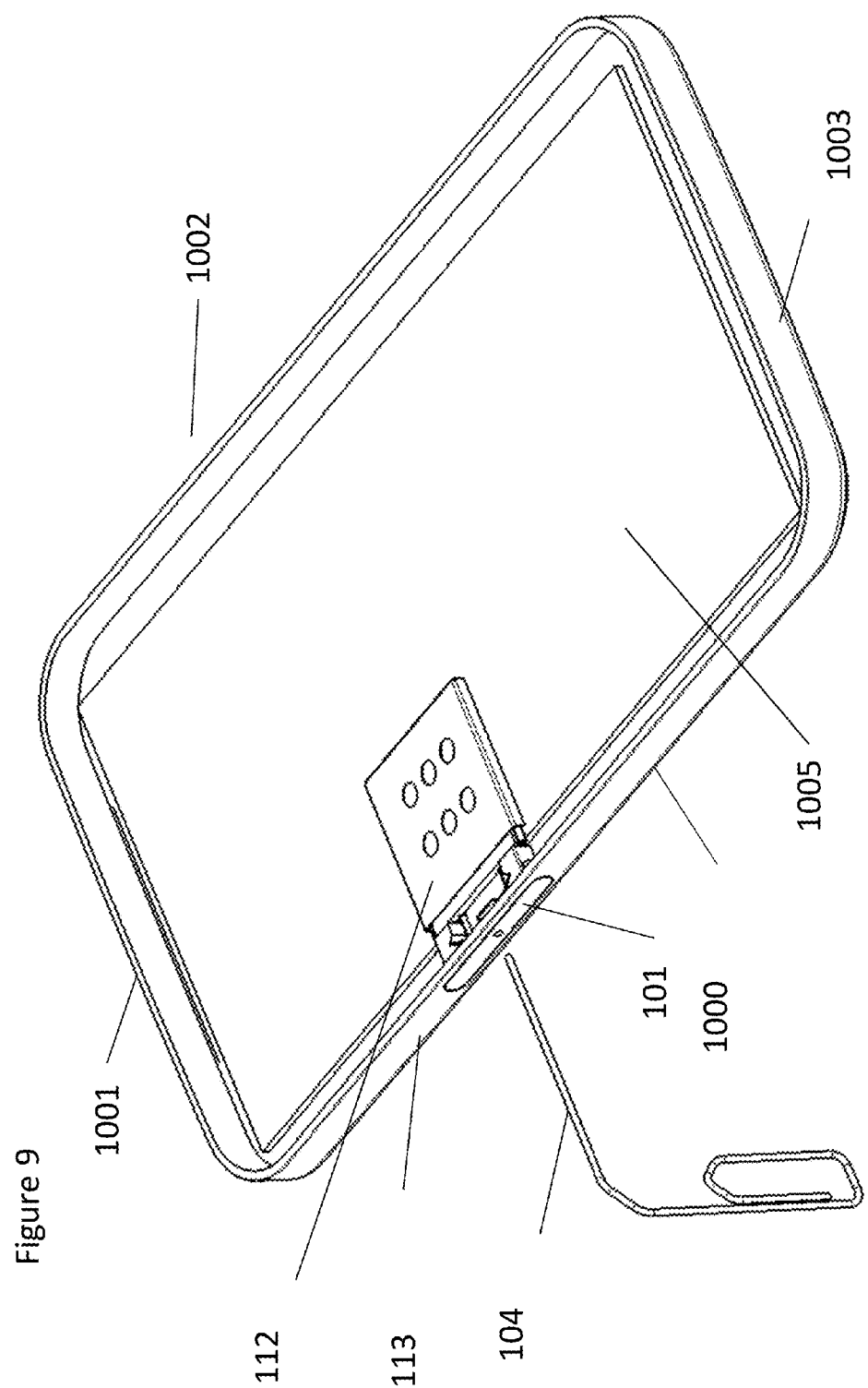
FIG. 9 presents an example embodiment of the invention, in which a card holder is shown in relation with an electronic device cover.

FIG. 9 is an example embodiment of the invention according to which the location of the card holder in relation with a cover 1000, 1001, 1002, 1003, of the electronic device 100. However, the location of the card holder may be on any of the sides 1000, 1001, 1002 and 1003 of the electronic device 100. According to this example embodiment, a printed wire board PWB 1005 is shown. The reading device has been integrated on the PWB 1005 and the cover is located on the PWB 1005. According to another embodiment of the invention, the card holder is not located on the PWB 1005 and an electrical connection is enabling the reading device to be connected to the PWB 1005.

Figure 10:
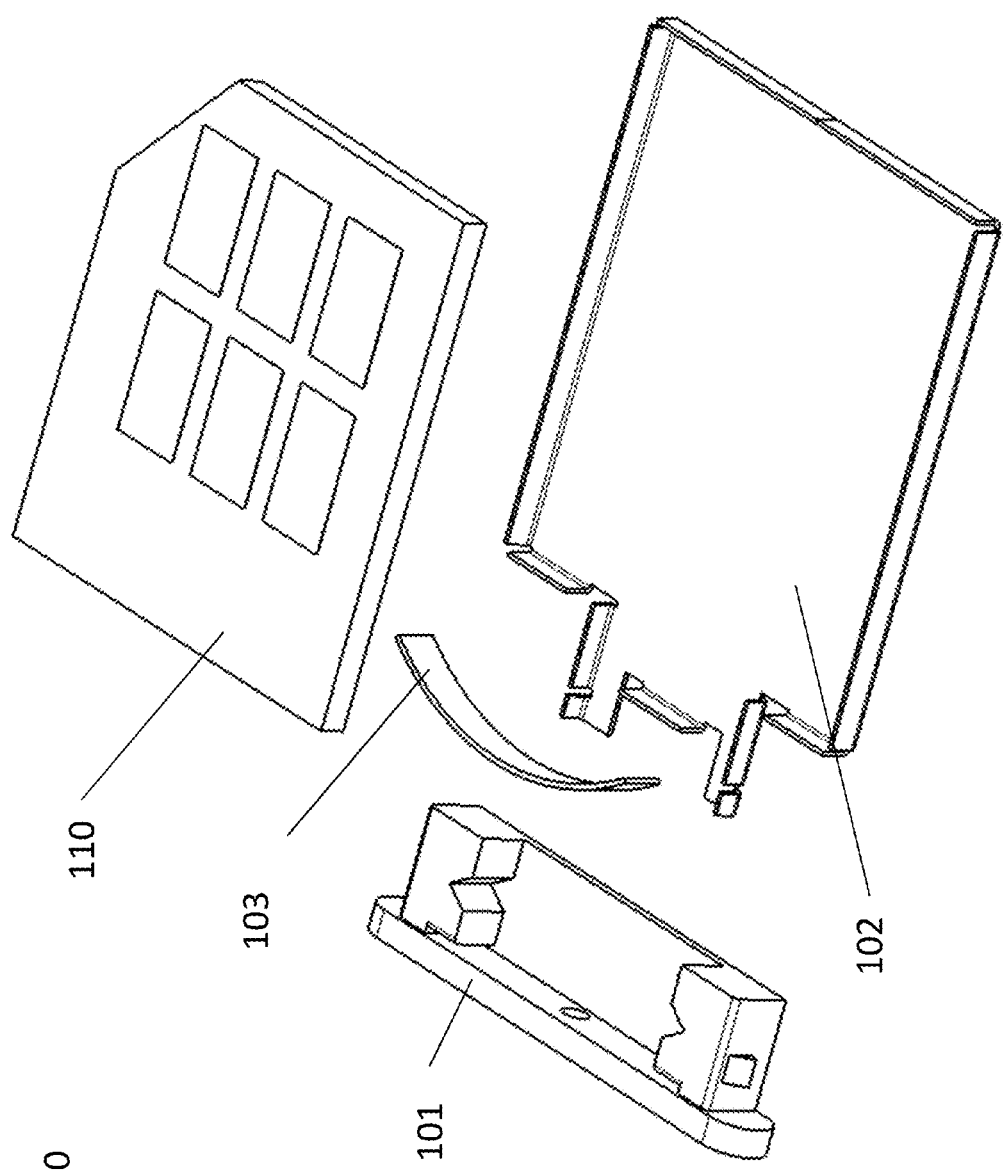
FIG. 10 presents an example embodiment of the invention, in which an exploded view is shown.

FIG. 10 is an example embodiment of the invention according to which an exploded view is presented where the door 101, resilient element 103, the tray 102 and a card 110 have been shown as separated elements. A reference is made to previous FIGS. 1-9.

Figure 11:
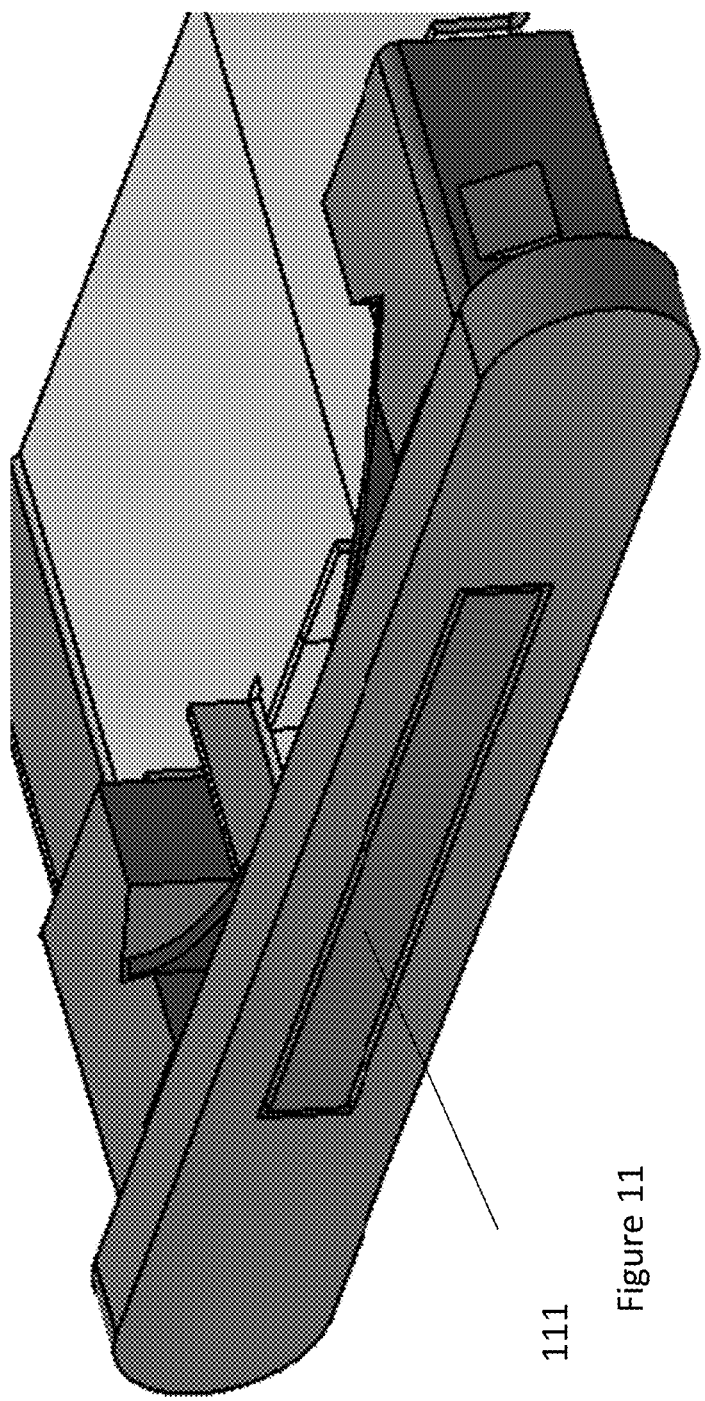
FIG. 11 presents an example embodiment of the invention, in which an aperture is shown.

FIG. 11 is an example embodiment of the invention according to which an aperture 111 is arranged to accommodate an additional component 1007, a depressable element (see FIG. 13) which may be pressed by for example a fingernail or a coin. The outer dimensions of the aperture are different from what has been presented in the example embodiments of FIGS. 1-11 to accommodate the additional component 1007.

Figure 12:
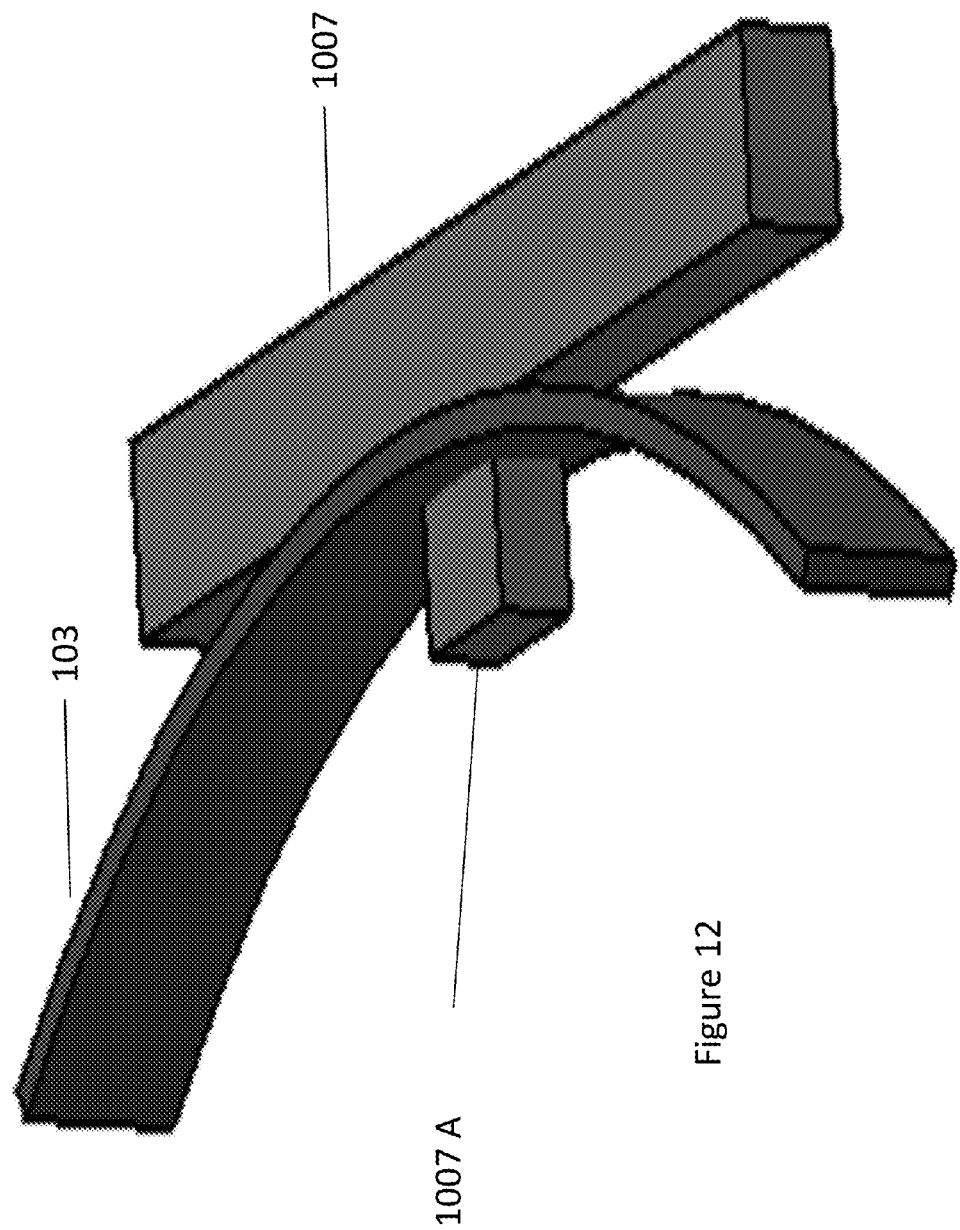
FIG. 12 presents an example embodiment of the invention, in which an additional component is shown.

FIG. 12 is an example embodiment of the invention according to which the additional component 1007 is arranged to be attached to the resilient element 103. Part 1007A of the additional component is arranged to protrude from the resilient element 103 towards the tray 102.

Figure 13:
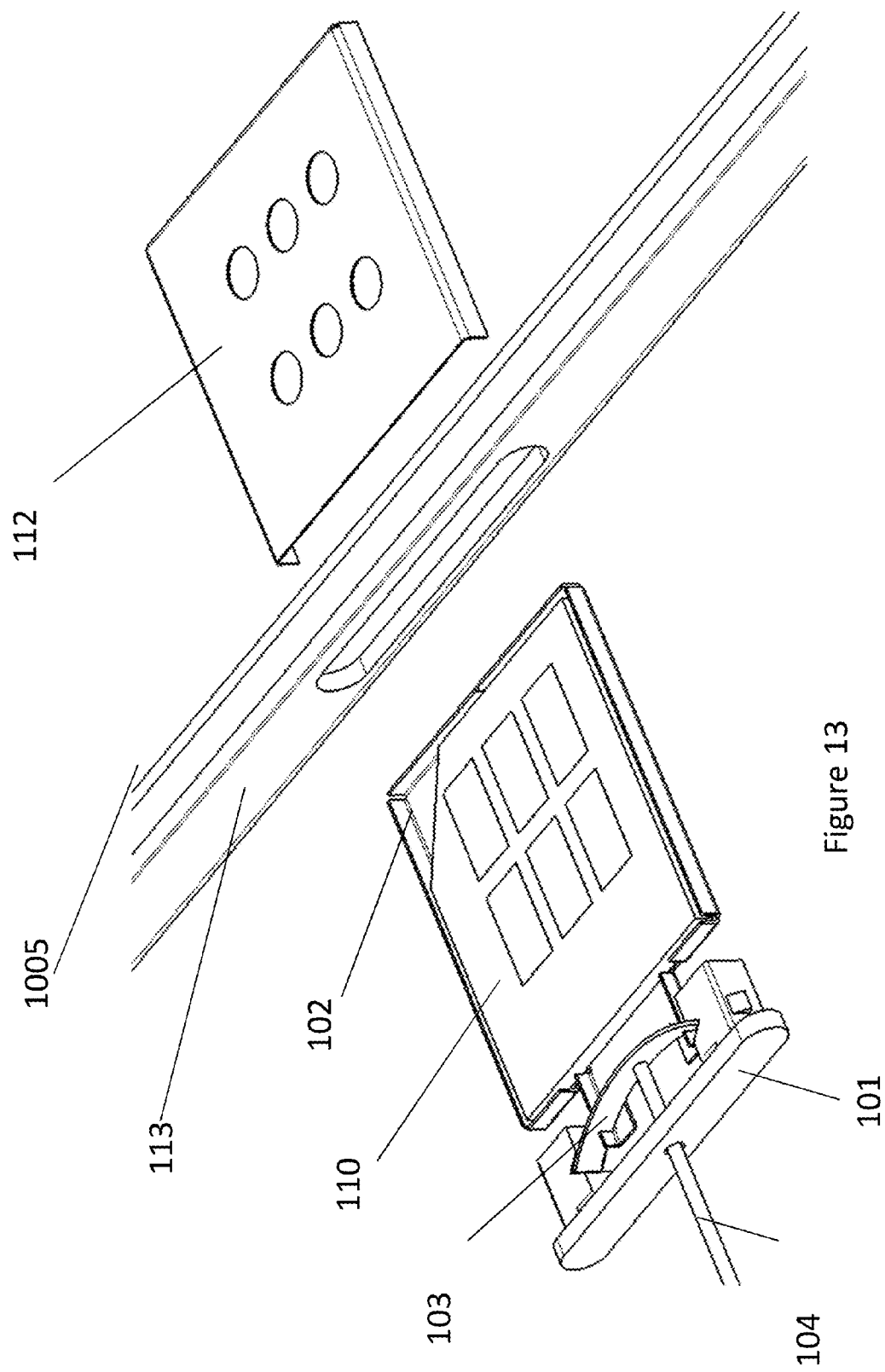
FIG. 13 presents an example embodiment of the invention, in which a card reader is shown.
Figure 14:
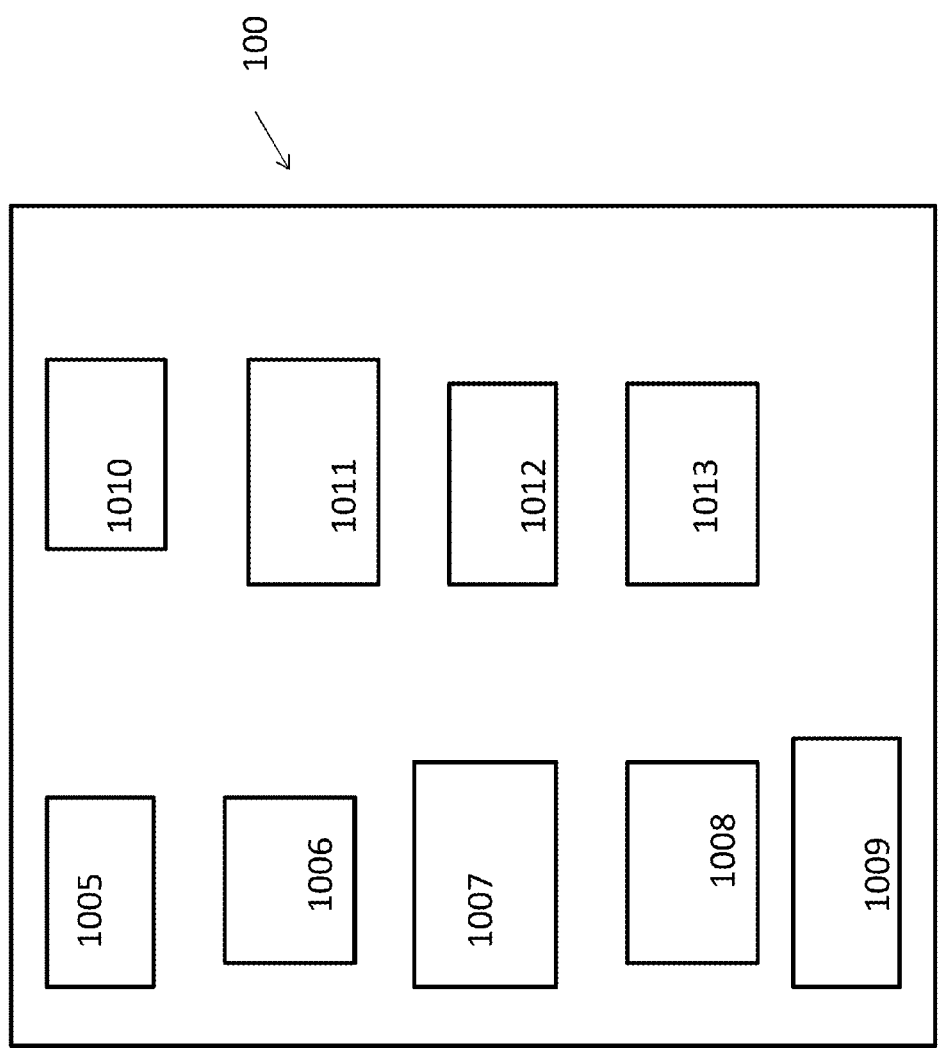
FIG. 14 presents an example embodiment of the invention, in which a block diagram is shown is shown, describing an electronic device.

FIG. 13 is an example embodiment of the invention according to which a card reader 112 is visible. The card reader 112 is configured to house the tray 102 when the tray 102 is in a closed position. The card reader 112 according to this example embodiment is an internally installed card reader. The card reader 112 is configured to read information from the card so that the user of the electronic device 100 is able to access information stored in the card. The card reader 112 is configured to allow data transfer between the electronic device 100 and the card. The card reader 112 is configured to save information from the electronic device 100 to the card. The card reader 112 is configured to retrieve information from the card to the electronic device 100. The shape of the card reader 112 is configured to accommodate and follow the shape of the tray and the card, but any other shape may be possible. The card reader may be dimensioned to receive a SIM (subscriber identity module) or a micro SIM or any other suitable card reader for allowing the electronic device to communicate. The card reader 112 may be located on the PWB 1005 near the aperture for inserting and removing the card, in the electronic devices 100 cover. FIG. 14 is an example embodiment of an electronic device 100 according to the invention. The electronic device 100 comprises a PWB 1005 configured to support different components of the electronic device 100. The electronic device 100 comprises a display 1006 configured to show information to a user of the electronic device 100. A display 1006 may provide an output, in input and/or at least part of a user interface. The display 1006 may be configured to show information about functionality of the electronic device 100 to a user. The display 1006 may be configured to show an application running in the electronic device 100. The display 1006 may be for example but not limited to a touch display with resistive or capcitive features or an electronic ink display or a liquid crystal display LCD. The electronic device 100 comprises input 1007 configured to provide a user of the electronic device 100 a means of inputting characters and/or numbers into the electronic device 100. The input 1007 may be for example but not limited to a mechanical key or mechanical keys, a joystick, a navigation key, a scroll key or a touch display element. The electronic device 100 comprises a power source 1008 configured to provide power to the electronic device 100. The power source 1008 may be for example but not limited to a solar cell battery or a li-ion battery. The electronic device 100 comprises a transceiver 1009. The transceiver of an electronic device 100 may comprise for example an antenna/transmitter/receiver 1009, configured to provide connection to a network. The transceiver may transmit and receive e.g. radio frequency (RF) signals to/from external network and/or device. The network may comprise code division multiple access (CDMA), wideband code division multiple access (WCDMA), 3rd generation (3G), 4th generation (4G), global system for mobile communications (GSM), wireless local area network (WLAN). The electronic device 100 may comprise logic/control/memory 1010 configured to store, organize and process information. The logic/control/memory block 1010 may at least partly control internal data, operations and/or functions of the electronic device 100. A processor 1011 is configured to process information. The processor 1011 may execute instructions and enable operation of the electronic device 100. A speaker 1012 is configured to convert audio signals into sound, and a microphone 1013 is configured to receive for example pressure waves of a sound, and convert the pressure waves into electrical signals.

The electronic device 100 may be at least one of the following; a mobile/cellular phone, a lap top computer, an internet tablet, a MP3/music player, a gaming device, a personal digital assistant. Or any other device having memory and capable of retrieving and saving information on a card.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A card holder comprising:
a tray configured to receive a card;
a door; and
a resilient element in contact with the door and the tray, wherein the resilient element is configured to move from a first position to a second position upon application of a force on the resilient element, wherein the movement from the first position to the second position deflects the resilient element, and the resilient element is disposed with respect to the door and the tray in such a way as to provide for deflection of the resilient element so as to reverse the initial shape of the resilient element such that the deflection of the resilient element causes a tension exhibiting symmetry about a central point of the resilient element so that the resilient element exerts a force on the door so as to cause the door to move with respect to the tray.

2. The card holder of claim 1, wherein the resilient element is housed in the card holder and is configured to pivot about cavities located on either side of the door.

3. The card holder of claim 2, wherein each of the cavities forms a notch configured to accommodate an end of the resilient element.

4. The card holder of claim 1, wherein the resilient element lies at least partially within at least one slot in the tray.

5. The card holder of claim 1, wherein the resilient element is attached to the tray.

6. The card holder of claim 1, wherein the first position of the resilient element corresponds to a first position of the door with respect to the tray.

7. The card holder of claim 1, wherein the second position of the resilient element corresponds to a second position of the door with respect to the tray.

8. The card holder of claim 1, wherein the resilient element is configured to be convex in the first position and concave in the second position.

9. The card holder of claim 1, wherein the resilient element is any one of a spring and a longitudinal planar member.

10. The card holder of claim 1, wherein the tray further comprises a flange and the resilient element abuts the flange in the second position.

11. The card holder of claim 1, wherein the door comprises an aperture allowing passage of an object through the door and the resilient element is attached to the door in such a way that pressure exerted by the object deflects the resilient element.

12. The card holder of claim 1, the card holder further comprising depressible means to the door and configured so that a force is exerted on the resilient element upon depression of the depressible means.

13. The card holder of claim 1, wherein the card holder is disposed in an electronic device.

14. The card holder of claim 13, wherein the tray is configured, when the resilient element is in a second position, to be removed from the electronic device by application of a pulling force on the door in a direction away from the electronic device.

15. The card holder of claim 13, wherein the door forms part of an outer cover of the electronic device when the resilient element is in the first position.

16. The card holder of claim 13, wherein the electronic device comprises at least one of the following; a wireless phone, a wireless Internet device, a lap top computer, an internet tablet, a MP3/music player, a gaming device, a personal digital assistant.

17. An electronic device having disposed therein a card holder comprising:
   a tray configured to receive a card;
   a door; and
   a resilient element in contact with the door and the tray, wherein the resilient element is configured to move from a first position to a second position upon application of a force on the resilient element, wherein the movement from the first position to the second position deflects the resilient element so as to reverse the initial shape of the resilient element, and the resilient element is disposed with respect to the door and the tray in such a way that the deflection of the resilient element causes tension exhibiting symmetry about a central point of the resilient element so that the resilient element exerts a force on the door so as to cause the door to move with respect to the tray.

18. The electronic device of claim 17, wherein the resilient element is housed in the card holder and is configured to pivot about cavities located on either side of the door.

19. The electronic device of claim 18, wherein each of the cavities forms a notch configured to accommodate an end of the resilient element.

20. A card holder comprising:
   a tray configured to receive a card, wherein the tray comprises a flange;
   a door comprising a flange, wherein the door is configured to come into contact with the flange of the tray when the door is pulled in a direction away from the card holder; and
   a resilient element in contact with the door and the tray, wherein the resilient element is configured to move from a first position to a second position upon application of a force on the resilient element, wherein the resilient element abuts the flange in the second position, wherein the movement from the first position to the second position deflects the resilient element, and the resilient element is disposed with respect to the door and the tray in such a way that the deflection of the resilient element causes tension in the resilient element so that the resilient element exerts a force on the door so as to cause the door to move with respect to the tray.

* * * * *